US008741707B2

(12) United States Patent
Disney et al.

(10) Patent No.: US 8,741,707 B2
(45) Date of Patent: Jun. 3, 2014

(54) METHOD AND SYSTEM FOR FABRICATING EDGE TERMINATION STRUCTURES IN GAN MATERIALS

(75) Inventors: Donald R. Disney, Cupertino, CA (US); Isik C. Kizilyalli, San Francisco, CA (US); Linda Romano, Sunnyvale, CA (US); Andrew Edwards, San Jose, CA (US); Hui Nie, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 265 days.

(21) Appl. No.: 13/335,383

(22) Filed: Dec. 22, 2011

(65) Prior Publication Data
US 2013/0161634 A1    Jun. 27, 2013

(51) Int. Cl.
*H01L 21/338* (2006.01)
*H01L 29/18* (2006.01)
*H01L 29/872* (2006.01)
*H01L 29/06* (2006.01)
*H01L 29/20* (2006.01)
*H01L 21/04* (2006.01)

(52) U.S. Cl.
CPC .......... *H01L 29/872* (2013.01); *H01L 29/0619* (2013.01); *H01L 29/2003* (2013.01); *H01L 21/0495* (2013.01)
USPC ........... 438/179; 438/285; 438/424; 438/478; 438/745; 257/76; 257/78; 257/500; 257/501; 257/502; 257/504; 257/524; 257/E21.214; 257/E21.407; 257/E29.089; 257/E29.255

(58) Field of Classification Search
CPC .............. H01L 29/872; H01L 29/0619; H01L 29/2003; H01L 21/0495
USPC ............ 438/179, 285, 424, 478, 745; 257/76, 257/78, 500, 501, 502, 504, 524, E21.214, 257/E21.407, E29.089, E29.255
See application file for complete search history.

(56) References Cited

U.S. PATENT DOCUMENTS

| 7,777,305 B2 * | 8/2010 | Kuroda et al. ................. 257/624 |
| 8,445,341 B2 * | 5/2013 | Matsushita ................... 438/179 |
| 2011/0037101 A1 * | 2/2011 | Nakazawa et al. ............ 257/192 |

* cited by examiner

*Primary Examiner* — Dao H Nguyen
(74) *Attorney, Agent, or Firm* — Kilpatrick Townsend & Stockton LLP

(57) ABSTRACT

A method for fabricating an edge termination, which can be used in conjunction with GaN-based materials, includes providing a substrate of a first conductivity type. The substrate has a first surface and a second surface. The method also includes forming a first GaN epitaxial layer of the first conductivity type coupled to the first surface of the substrate and forming a second GaN epitaxial layer of a second conductivity type opposite to the first conductivity type. The second GaN epitaxial layer is coupled to the first GaN epitaxial layer. The substrate, the first GaN epitaxial layer and the second GaN epitaxial layer can be referred to as an epitaxial structure.

28 Claims, 7 Drawing Sheets

METHOD AND SYSTEM FOR FABRICATING EDGE TERMINATION STRUCTURES IN GAN MATERIALS

BACKGROUND OF THE INVENTION

Power electronics are widely used in a variety of applications. Power semiconductor devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same. Vertical power devices, in which the primary current flows from the top surface vertically down through the substrate, are often used in applications that require high voltage and/or current levels.

SUMMARY OF THE INVENTION

The present invention relates generally to electronic devices. More specifically, the present invention relates to forming edge termination structures in III-nitride semiconductor materials. Merely by way of example, the invention has been applied to methods and systems for manufacturing edge termination structures for semiconductor devices using trench and refill techniques and/or ion implantation into gallium-nitride (GaN) based epitaxial layers to electrically isolate device regions from edge termination regions. The methods and techniques can be applied to a variety of power semiconductor devices such as Schottky diodes, PN diodes, vertical junction field-effect transistors (JFETs), thyristors, bipolar transistors, and other devices.

According to an embodiment of the present invention, a method for fabricating an edge termination structure is provided. The method, which can be used in conjunction with GaN-based materials, includes providing a substrate of a first conductivity type. The substrate has a first surface and a second surface. The method also includes forming a first GaN epitaxial layer of the first conductivity type coupled to the first surface of the substrate and forming a second GaN epitaxial layer of a second conductivity type opposite to the first conductivity type. The second GaN epitaxial layer is coupled to the first GaN epitaxial layer. The substrate, the first GaN epitaxial layer and the second GaN epitaxial layer can be referred to as an epitaxial structure.

According to one embodiment of the present invention, a method for fabricating an edge termination structure is provided. The method includes providing a GaN substrate of a first conductivity type. The GaN substrate has a first surface and a second surface, the first surface opposite the second surface in a vertical dimension. The method further includes forming a first GaN epitaxial layer of the first conductivity type coupled to the first surface of the GaN substrate, and forming an insulating region in a first portion of the first GaN epitaxial layer. The insulating region extends vertically through at least 90% of the first GaN epitaxial layer to separate an active device region of the first GaN epitaxial layer from an outer region of the first GaN epitaxial layer. The insulating region circumscribes the active device region.

According to another embodiment of the present invention, a method of fabricating a vertical power device structure is provided. The method includes forming an epitaxial structure by providing a III-nitride substrate of a first conductivity type characterized by a first dopant concentration, and forming a first III-nitride epitaxial layer of the first conductivity type having a thickness and coupled to a first surface of the III-nitride substrate. The method further includes defining regions of the epitaxial structure by forming an insulating region of the epitaxial structure. The insulating region electrically separates a device region of the epitaxial structure from an outer region of the epitaxial structure. The method also includes forming one or more active devices using at least the device region of the epitaxial structure. The insulating region extends vertically through at least 90% of the thickness of the first III-nitride epitaxial layer.

According to yet another embodiment of the present invention, a semiconductor structure is provided. The semiconductor structure includes a GaN substrate having a first surface and a second surface opposing the first surface. The GaN substrate is characterized by a first conductivity type and a first dopant concentration. The semiconductor structure further includes a first GaN epitaxial layer of the first conductivity type coupled to the second surface of the GaN substrate. The first GaN epitaxial layer includes an active device region, an outer region, and an insulating region disposed between the active device region and the outer region. The insulating region has a thickness greater than 90% of a thickness of the first GaN epitaxial layer.

Numerous benefits are achieved by way of the present invention over conventional techniques. For example, embodiments of the present invention provide an edge termination structures that realize a significant percentage of the ideal parallel-plane breakdown voltage for a given drift region design. The present invention also provides final structures that are fully or substantially planar, that do not have any exposed etched sidewalls (which can be a source of off-state leakage current), and that are less expensive to manufacture. Moreover, the present edge termination structure consumes much less area for a given breakdown voltage than other edge termination structures such as floating guard rings. These and other embodiments of the invention, along with many of its advantages and features, are described in more detail in conjunction with the text below and attached figures.

Figure 1:
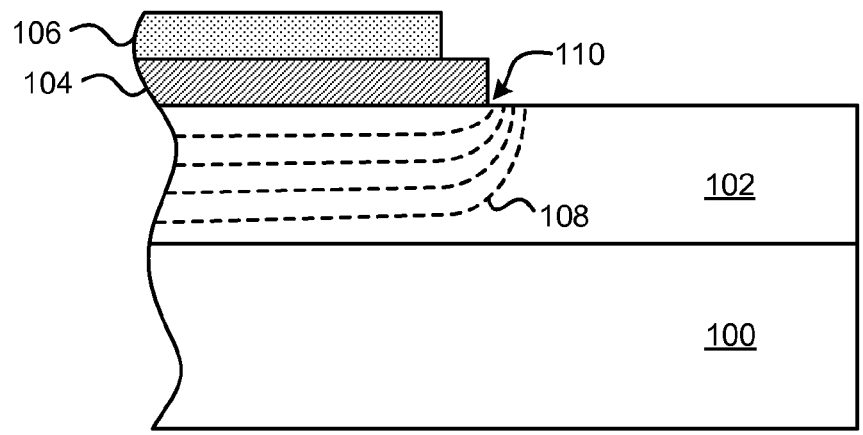
FIG. 1 is a simplified cross-sectional diagram of a portion of a semiconductor device, illustrating how electric field crowding near the corner of a planar junction limits the breakdown voltage of the semiconductor device.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF THE INVENTION

Embodiments of the present invention relate to electronic devices. More specifically, the present invention relates to forming edge termination structures to increase the breakdown voltage of power semiconductor devices. Merely by way of example, the invention has been applied to methods and systems for manufacturing edge termination structures by etching and/or ion implantation into gallium-nitride (GaN) based epitaxial layers. The methods and techniques can be applied to form a variety of types of edge termination structures that can provide edge termination to numerous types of semiconductor devices, including, but not limited to, junction field-effect transistors (JFETs), diodes, thyristors, vertical field-effect transistors, thyristors, and other devices, including merged PN Schottky diodes such as those discussed in U.S. patent application Ser. No. 13/270,606, filed on Oct. 11, 2011, the disclosure of which is hereby incorporated by reference in its entirety.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, $\rho$, because resistivity is inversely proportional to electron mobility, as provided by equation (1):

$$\rho = \frac{1}{q\mu N}, \quad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \frac{\rho L}{A}, \quad (2)$$

where A is the cross-sectional area of the channel or current path.

As described herein, semiconductor devices utilizing edge termination structures are able to exploit the high critical electric field provided by GaN and related alloys and heterostructures. Edge termination structures provide proper edge termination by alleviating high fields at the edge of the semiconductor device. When properly employed, edge termination allows a semiconductor device to break down uniformly at its main junction rather than uncontrollably at its edge. According to some embodiments of the present invention, the portion of the semiconductor device used to conduct current in the on-state is referred to as an active device, an active region, or an active device region, to differentiate this region or portion of the device from the edge termination region, which typically does not contribute to forward conduction. Examples of active devices described herein include Schottky diodes, PN diodes, PIN diodes, JFETs, and the like. Within the scope of this invention, the edge termination structures and methods described here may be combined with many other types of active devices fabricated in GaN substrates, including but not limited to MOSFETs, MESFETs, PN diodes, bipolar transistors, and the like.

According to embodiments of the present invention, gallium nitride (GaN) epitaxy on pseudo-bulk GaN substrates is utilized to fabricate edge termination structures and/or semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

FIG. 1 is a simplified cross-sectional diagram of a portion of a semiconductor device, according to one embodiment, illustrating how the edge termination structures provided herein can be used to improve the semiconductor device's performance using edge termination. FIG. 1 illustrates a diode structure where a PN junction is created between a p-type semiconductor layer 104 formed on an n-type epitaxial layer 102, formed on semiconductor substrate 100. In this example, a metal layer 106 is also formed on the p-type semiconductor layer 104 to provide electrical connectivity to the diode. Metal layer 106 may or may not share the same edge as p-type semiconductor layer 104.

Because the diode of FIG. 1 has no termination structures, its breakdown voltage is reduced. The electric field 108 (represented in FIG. 1 as potential contour lines), is crowded near the edge 110 of the diode, causing breakdown at a voltage that can be much less than the parallel plane breakdown voltage for the diode. This phenomenon can be especially detrimental to the operation of high-voltage semiconductor devices.

Figure 2:
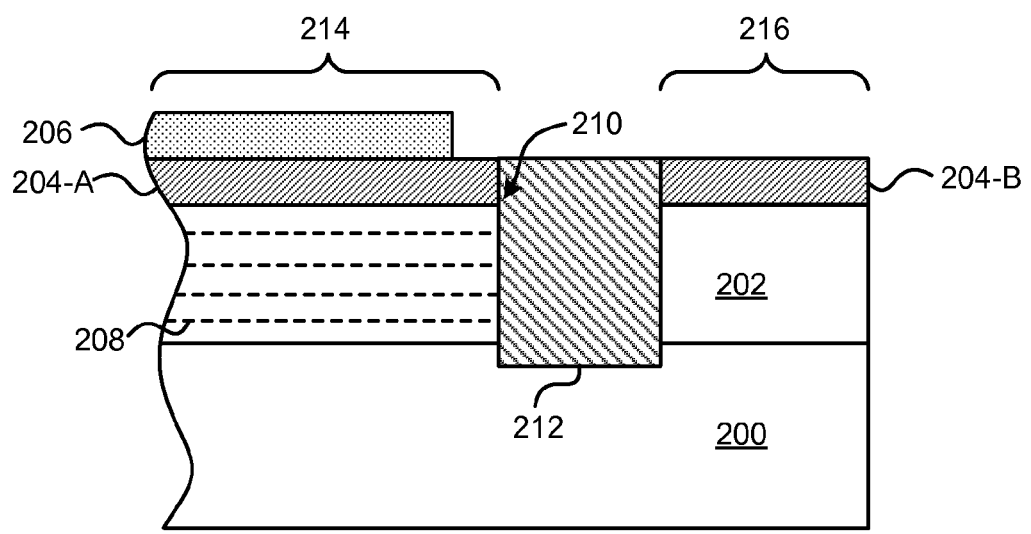
FIG. 2 is a simplified cross-sectional diagram of a PN diode according to an embodiment of the present invention.

FIG. 2 illustrates one embodiment of the present invention. A p-n junction is created between a p-type semiconductor layer 204-A formed on an n-type epitaxial layer 202, formed on semiconductor substrate 200. In this example, a metal layer 206 is also formed on the p-type semiconductor layer 204-A to provide electrical connectivity to the diode. Metal layer 206 may or may not share the same edge as the p-type semiconductor layer 204-A. An insulating region 212 is inserted into a portion of the p-type semiconductor layer 204-A and the n-type epitaxial layer 202, separating them into an active device region 214 and an outer region 216. The outer region may include a p-type semiconductor layer 204-B as a result of certain manufacturing steps, but which may not perform any particular function in the semiconductor device. Because little or no charge is present in insulating region 212, the potential contour lines 208 are substantially horizontal. Thus, the electric field lines are not crowded at the edge 210 of the diode. By reducing the electric field in this manner, the insulating region 212 enables the diode to operate at a breakdown voltage much closer to its parallel plane breakdown voltage.

Figure 3A:
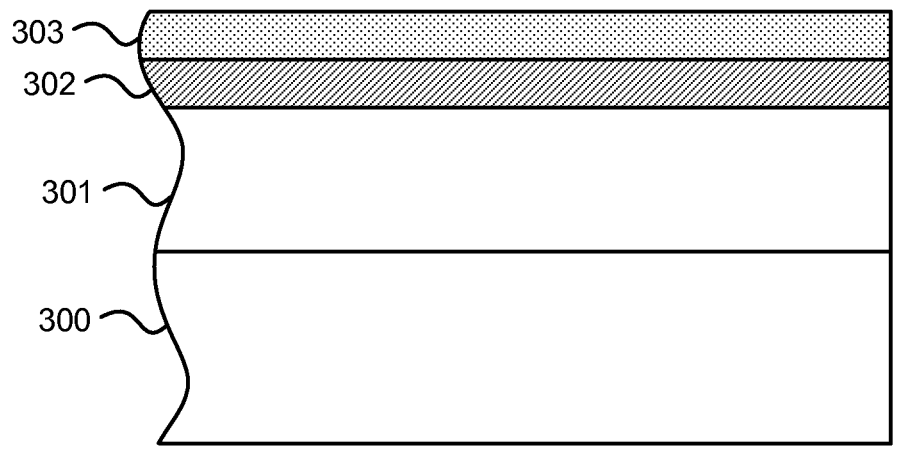
FIGS. 3A-3D are simplified cross-sectional diagrams illustrating fabrication of a PN diode in GaN with an edge termination structure formed through etching and refill of a portion of an epitaxial layer according to another embodiment of the present invention.

FIGS. 3A-3D illustrate one embodiment of a process for creating a PN diode in GaN with the edge termination structures illustrated in FIG. 2. Referring to FIG. 3A, a first GaN epitaxial layer 301 is formed on a GaN substrate 300 having the same conductivity type. As indicated above, the GaN substrate 300 can be a pseudo-bulk or bulk GaN material on which the first GaN epitaxial layer 301 is grown. Dopant concentrations (e.g., doping density) of the GaN substrate 300 can vary, depending on desired functionality. For example, a GaN substrate 300 can have an n+ conductivity type, with dopant concentrations ranging from $1 \times 10^{17}$ cm$^{-3}$ to $1 \times 10^{19}$ cm$^{-3}$. Although the GaN substrate 300 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 301 can also vary, depending on desired functionality. The first GaN epitaxial layer 301 can serve as a drift region for the PN diode, and therefore can be a relatively low-doped material. For example, the first GaN epitaxial layer 301 can have an n− conductivity type, with dopant concentrations ranging from $1 \times 10^{14}$ cm$^{-3}$ to $1 \times 10^{18}$ cm$^{-3}$. Furthermore, the dopant concentration can be uniform, or can vary, for example, as a function of the thickness of the drift region.

The thickness of the first GaN epitaxial layer 301 can also vary substantially, depending on the desired functionality. As discussed above, homoepitaxial growth can enable the first GaN epitaxial layer 301 to be grown far thicker than layers formed using conventional methods. In general, in some embodiments, thicknesses can vary between 0.5 μm and 100 μm, for example. In other embodiments thicknesses are greater than 5 μm. Resulting parallel plane breakdown voltages for the PN diode can vary depending on the embodiment. Some embodiments provide for breakdown voltages of at least 100V, 300V, 600V, 1.2 kV, 1.7 kV, 3.3 kV, 5.5 kV, 13 kV, or 20 kV.

FIG. 3A also illustrates the formation of a second GaN epitaxial layer 302 coupled to the first GaN epitaxial layer 301. The second GaN epitaxial layer 302 may have a conductivity type opposite the conductivity type of the first GaN epitaxial layer 301. For instance, if the first GaN epitaxial layer 301 is formed from an n-type GaN material, the second GaN epitaxial layer 302 will be formed from a p-type GaN material, and vice versa. The thickness of the second GaN epitaxial layer 302 can vary, depending on the process used to form the layer and the device design. In some embodiments, the thickness of the second GaN epitaxial layer 302 is between 0.1 μm and 5 μm. The second GaN epitaxial layer 302 can be highly doped, for example in a range from about $5 \times 10^{17}$ cm$^{-3}$ to about $1 \times 10^{19}$ cm$^{-3}$. Additionally, as with other epitaxial layers, the dopant concentration of the second GaN epitaxial layer 302 can be uniform or non-uniform as a function of thickness. In some embodiments, the dopant concentration increases with thickness, such that the dopant concentration is relatively low near the first GaN epitaxial layer 301 and increases as the distance from the first GaN epitaxial layer 301 increases. Such embodiments provide higher dopant concentrations at the top of the second GaN epitaxial layer 302 where metal contacts can be subsequently formed. Other embodiments utilize heavily doped contact layers (not shown) to form Ohmic contacts.

FIG. 3A also illustrates the formation of a mask layer 303. In one embodiment, mask layer 303 is formed by growing or depositing a layer of material that inhibits the growth of GaN material during the subsequent epitaxial regrowth process. This material may be, for example, silicon dioxide, silicon nitride, or another suitable material.

Figure 3B:
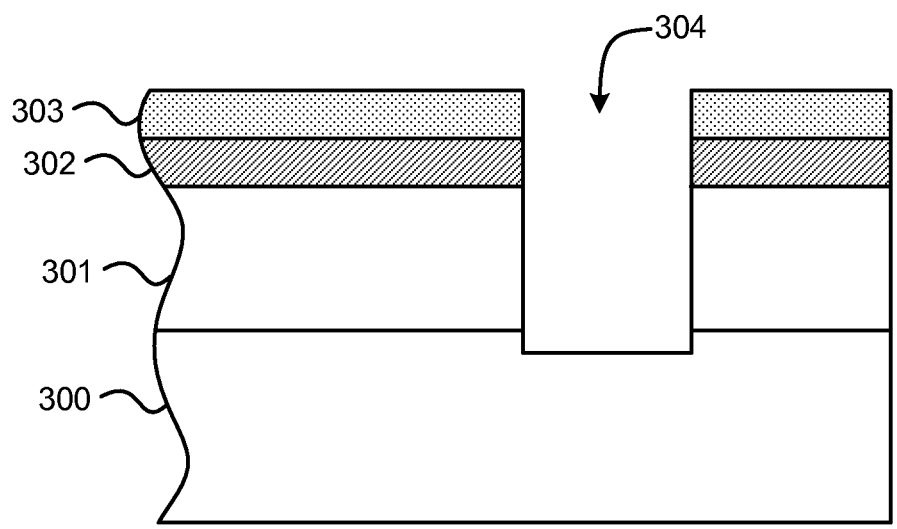

In FIG. 3B the mask layer 303 has been patterned using photolithography and etching techniques. The remaining portions of mask layer 303 serve as a mask for etching a trench 304 completely through second GaN epitaxial layer 302 and completely through, or at least through a substantial portion (e.g. 90%) of, the thickness of the first GaN epitaxial layer 301. When the PN junction formed by second GaN epitaxial layer 302 and first GaN epitaxial layer 301 is reverse biased, a depletion region extends from the PN junction down into first GaN epitaxial layer 301. The vertical extent of this depletion region depends on the intended breakdown voltage (BV) of the PN diode. In some embodiments, the depth of trench 304 is at least as deep as the desired vertical extent of the depletion region, so that the potential contour lines will remain substantially horizontal, as shown in FIG. 2. In one embodiment, trench 304 extends completely through first GaN epitaxial layer 301 and into the GaN substrate 300. This allows for complete vertical depletion of the first GaN epitaxial layer 301, so that the thickness of the first GaN epitaxial layer 301 can be minimized for a given BV, which results in lower on-state resistance for the PN diode.

Different dopants can be used to create n- and p-type GaN epitaxial layers and structures disclosed herein. For example, n-type dopants can include silicon, oxygen, selenium, tellurium, or the like. P-type dopants can include magnesium, beryllium, calcium zinc, or the like.

Figure 3C:
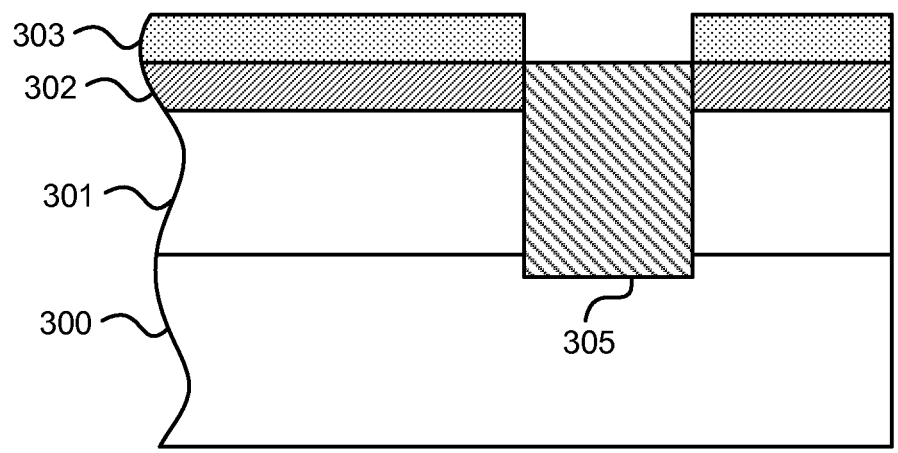

FIG. 3C illustrates the filling of the trench 304 by an insulating material 305. Insulating material 305 contains little or no charge, such that few or none of the electric field lines originating from charge in second GaN epitaxial layer 302 terminate within insulating material 305. Thus, all of these electric field lines must terminate on charge in the depletion region of first GaN epitaxial layer 301, such that the potential contour lines will remain substantially horizontal, as shown in FIG. 2. In one embodiment, insulating material 305 comprises an insulating GaN material, which may be undoped, very lightly doped, or compensated such that there are very few ionized donor or acceptor atoms in this material. This insulating GaN material may be formed by selective epitaxial growth, wherein the GaN growth is inhibited by mask layer 303, such that it grows selectively on the bottom and sidewalls of trench 304. In some embodiments, the selective epitaxial growth conditions, the crystal orientation, and the dimensions of trench 304 are chosen such that the top of insulating GaN material 305 is substantially planar with the top of second GaN epitaxial layer 302.

In other embodiments, insulating material 305 may comprise single or multilayers of aluminum nitride, aluminum gallium nitride, zinc oxide, or other suitable insulating material that may preferably be formed by a selective epitaxial growth step. In other embodiments, a thin layer of single or multilayers of aluminum nitride, aluminum gallium nitride, or other suitable insulating material may be formed as a liner on the sidewalls and bottom of trench 304, and the trench refill may be completed by an insulating GaN material as described above.

In yet other embodiments, insulating material 305 may comprise a dielectric material, such as silicon dioxide, silicon nitride, spin-on-glass, benzocyclobutene, or other suitable materials. Combinations of these materials may also be used. A material with a high breakdown strength is preferable to be able to support the high electric fields present in the material when the PN junction is reverse biased.

Figure 3D:
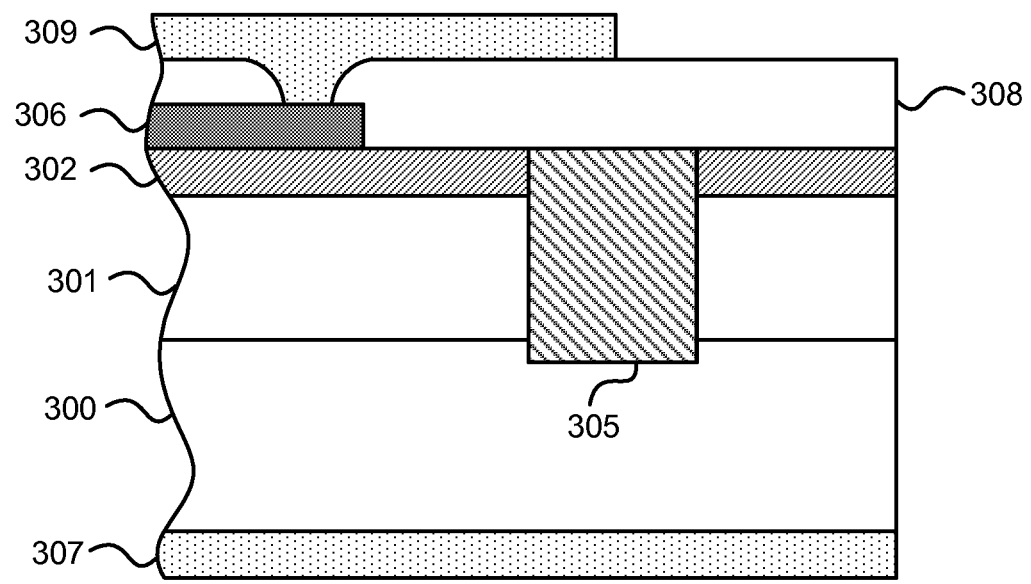

FIG. 3D illustrates the formation of a first metallic structure 307 on the bottom of the GaN substrate 300. The first metallic structure 307 can be one or more layers of metal that serve as an Ohmic contact for the cathode of the PN diode. For example, the first metallic structure 307 can comprise a titanium-aluminum (Ti/Al) metal. Other metals and/or alloys can be used including, but not limited to, aluminum, nickel, gold, combinations thereof, or the like. In some embodiments, an outermost metal of the first metallic structure 307 can include gold, silver, nickel, tantalum, tungsten, palladium, silver, tin, aluminum, combinations thereof, and the like. The first metallic structure 307 can be formed using any of a variety of methods such as sputtering, evaporation, or the like. After first metallic structure 307 is formed, an optional heat treatment may be performed to improve the characteristics of the metal and/or the contact between the metal and the GaN substrate 300. For example, a rapid thermal anneal (RTA) may be performed with a temperature in the range of 300° C. to 900° C. for a duration of one to ten minutes. In some embodiments, the ambient environment during the RTA may include nitrogen, hydrogen, oxygen, or a combination of these gases.

FIG. 3D further illustrates the formation of a second metallic structure 306 electrically coupled to at least a portion of the second GaN epitaxial layer 302 to serve as an electrical contact (e.g., an anode) for the PN diode. In one embodiment, second metallic structure 306 is formed of different materials than those used to form first metallic structure 307. For example, the materials used for second metallic structure 306 may be selected to optimize the Ohmic contact to the p-type material of the second GaN epitaxial layer 302 (e.g. platinum, palladium, nickel, or other suitable materials), while the materials used for first metallic structure 307 may be selected to optimize the Ohmic contact to n-type GaN substrate 300. After second metallic structure 306 is formed, an optional heat treatment may be performed to improve the characteristics of the metal and/or the contact between the metal and second GaN epitaxial layer 302. For example, an RTA may be performed with a temperature in the range of 300° C. to 900° C. for a duration of one to ten minutes. In some embodiments, the ambient environment during the RTA may include nitrogen, hydrogen, oxygen, or a combination of these gases. FIG. 3D also illustrates the formation of an optional field plate 309 coupled to second metallic structure 306 and extending laterally over at least a portion of insulating material 305. Dielectric layer 308 separates field plate 309 from the underlying GaN materials and may also provide some passivation of the GaN surface.

Figure 4A:
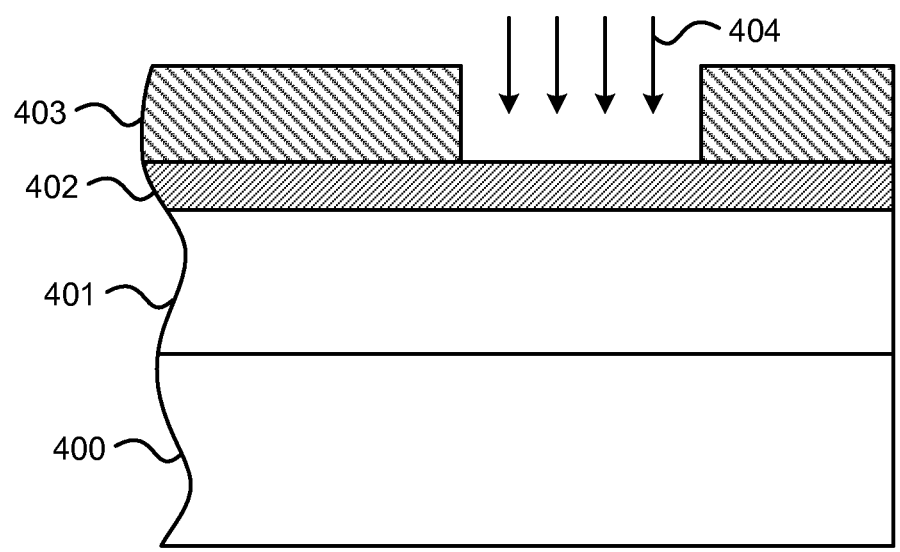
FIGS. 4A-4B are simplified cross-sectional diagrams illustrating fabrication of a PN diode in GaN with an edge termination structure formed by implanting into a portion of an epitaxial layer according to another embodiment of the present invention.
Figure 4B:
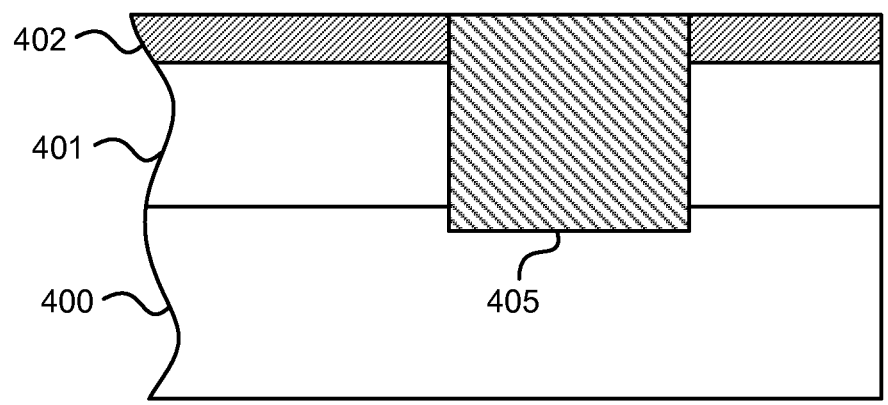

FIGS. 4A-4B illustrate another embodiment of a process for creating a PN diode in GaN with the edge termination structures, such as those illustrated in FIG. 2. FIG. 4A illustrates a first GaN epitaxial layer 401 is formed on a GaN substrate 400 having the same conductivity type. A second GaN epitaxial layer 402 is formed above the first GaN epitaxial layer 401. The properties of the GaN substrate 400, the first GaN epitaxial layer 401, and the second GaN epitaxial layer 402 can be similar to corresponding layers described above with reference to FIG. 3A. FIG. 4A also illustrates the formation of a masking layer 403 (e.g. photoresist, silicon dioxide, or other suitable material) with an opening through which an ion implantation 404 can be performed.

The ion implantation process illustrated in FIG. 4A is designed to dramatically reduce the conductivity of the implanted regions, effectively making the implanted region electrically insulating. Referring to FIG. 4B, the electrically insulating implanted regions 405 extends vertically completely through second GaN epitaxial layer 402 and completely through, or at least through a substantial portion of the first GaN epitaxial layer 401. In one embodiment, implanted region 405 extends completely through first GaN epitaxial layer 401 and into GaN substrate 400, as discussed more fully above, with reference to FIG. 3B. The implanted ion species may be argon, nitrogen, helium, hydrogen, or other appropriate species that produce an electrically insulating implanted region 405. In one embodiment, multiple implantations are performed through the same mask opening, each implant being performed at a different energy, such that the implanted profiles overlap each other vertically, thus forming a substantially continuous insulating region without a need to diffuse the dopants using a high temperature drive-in process. Thus, although the insulating implanted region 405 is illustrated as a homogeneous material in FIG. 4B, this is not required by the present invention, and the implant dose can vary as a function of the thickness of the second GaN epitaxial layer 402 as well as in the plane of the layer.

In one embodiment, four helium implantations may be performed with first, second, third, and fourth implantation energies of about 10 to 30 keV, about 40 to 80 keV, about 120 to 200 keV, and about 350 to 450 keV respectively. These helium implant doses may be in the range of $5 \times 10^{13}$ cm$^{-2}$ to $1 \times 10^{15}$ cm$^{-2}$. In the embodiment illustrated in FIG. 4B, the vertical depth of the implanted region 405 is greater than or equal to the vertical thickness of first GaN epitaxial layer 401. For devices with even thicker GaN epitaxial layers (i.e. higher BV devices), additional implantations may be performed at even higher energies to extend the vertical depth of the implanted region. Thus, in some embodiments, the ion implanted region extends into the first GaN epitaxial layer by a predetermined distance. After the ion implantation process(es), an optional high-temperature anneal may be performed to activate the implanted ions and/or repair damage in the GaN material which may be introduced by the ion implantation.

Although some embodiments are discussed in terms of GaN substrates and GaN epitaxial layers, the present invention is not limited to these particular binary III-V materials and is applicable to a broader class of III-V materials, in particular III-nitride materials. These materials are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

The above descriptions emphasize a process flow in which an n-type drift layer is grown using an n-type substrate. However, the present invention is not limited to this particular configuration. In other embodiments, substrates with p-type doping are utilized. Additionally, embodiments can use materials having an opposite conductivity type to provide devices with different functionality. Thus, although some examples relate to the growth of n-type GaN epitaxial layer(s) doped with silicon, in other embodiments the techniques described herein are applicable to the growth of highly or lightly doped material, p-type material, material doped with dopants in addition to or other than silicon such as Mg, Ca, Be, Ge, Se, S, O, Te, and the like. The substrates discussed herein can include a single material system or multiple material systems including composite structures of multiple layers. One of ordinary skill in the art would recognize many variations, modifications, and alternatives.

While the embodiments above are described in terms of a PN diode, a PIN (p-type, intrinsic, n-type) diode may be formed in a similar manner. By way of example, a PN diode may comprise n-type doping in the first GaN epitaxial layer and p-type doping in the second GaN epitaxial layer. A PIN diode, may comprise a very resistive first GaN epitaxial layer (i.e. lightly doped n-type or p-type, nearly the same resistivity as intrinsic, or undoped, GaN) and a p-type second GaN epitaxial layer.

Figure 5:
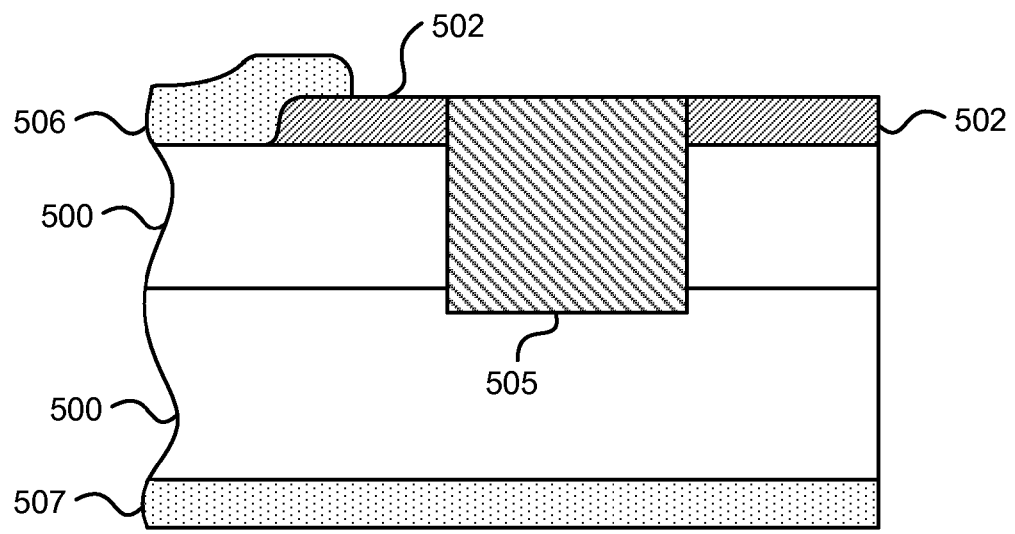
FIG. 5 is a simplified cross-sectional diagram of a Schottky diode according to another embodiment of the present invention.

FIG. 5 is a simplified cross sectional illustration of a Schottky diode with insulating region 505, which can be formed using trench etching and filling, or using ion implantation, as described above. The Schottky diode can include a GaN substrate 500, first GaN epitaxial layer 501, and first metallic structure 507, similar to those in the structures discussed previously. Here, first metallic structure 507 can function as a cathode of the Schottky diode. A second metallic structure 506 forms a Schottky contact with a portion of first GaN epitaxial layer 501. This portion of the first GaN epitaxial layer is not covered by a second GaN epitaxial layer 502, which has a conductivity type opposite that of first GaN epitaxial layer 501. In one embodiment, this is achieved by masking a portion of first GaN epitaxial layer 501 during the growth of second GaN epitaxial layer 502. In another embodiment, second GaN epitaxial layer 502 is grown and then masking and etching are used to remove a portion of second GaN epitaxial layer 502. Second metallic structure 506 also forms an Ohmic contact with the second GaN epitaxial layer 502.

Figure 6:
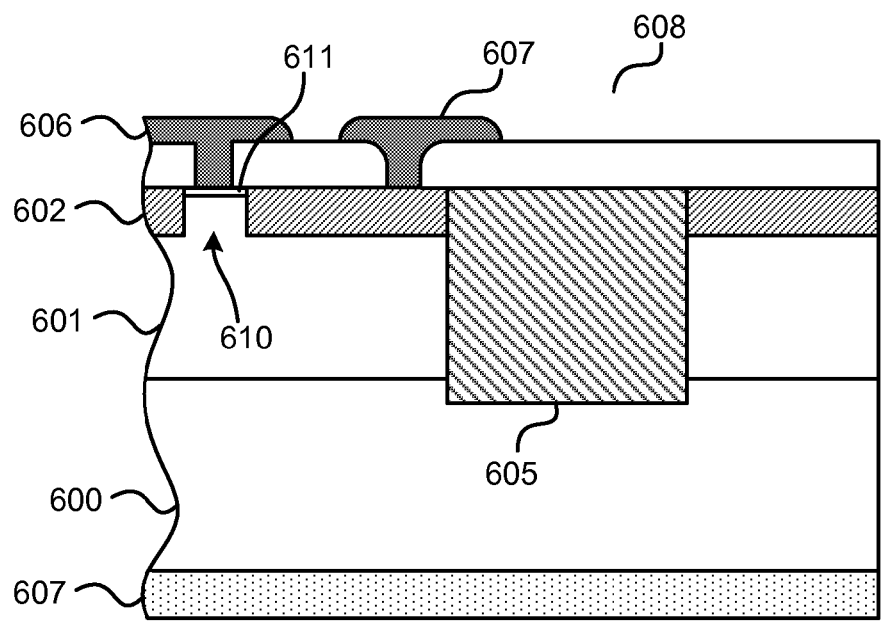
FIG. 6 is a simplified cross-sectional diagram of a vertical JFET according to another embodiment of the present invention.

FIG. 6 is a simplified cross sectional illustration of a vertical JFET with insulating region 605, which can be formed using trench etching and filling, or using ion implantation, as described above. The vertical JFET can include a GaN substrate 600, first GaN epitaxial layer 601, and first metallic structure 607, similar to those in the structures discussed previously. Here, first metallic structure 607 can function as a drain electrode of the vertical JFET. Additionally, the vertical JFET can include a channel region 610, which can be formed by etching a portion of first GaN epitaxial layer 601, or may be formed as an additional epitaxial layer with the same doping type. Furthermore, a source region 611 can be formed at the top of the channel region 610. Gate regions can be formed from epitaxial growth of a second GaN epitaxial layer 602, which has an opposite conductivity type as the first GaN epitaxial layer 601. Finally, a gate electrode (i.e., first metallic structure 607) and a source electrode 606 can provide Ohmic contact to the gate regions (e.g., portions of the second GaN epitaxial layer 602 adjacent to the channel region 610) and the source region 611, respectively. In some embodiments, the first metallic structure 607 may extend laterally over the insulating region 605 to form a field plate, with a dielectric or other insulating material 608 disposed between the first metallic structure 607 and the insulating region 605.

For example, in some embodiments, the GaN substrate 600 can have an n+ conductivity type with dopant concentrations ranging from $1 \times 10^{17}$ cm$^{-3}$ to $1 \times 10^{19}$ cm$^{-3}$, and the first GaN epitaxial layer 601 can have a n+ conductivity type, with dopant concentrations ranging from $1 \times 10^{14}$ cm$^{-3}$ to $1 \times 10^{18}$ cm$^3$. The thickness of the first GaN epitaxial layer 601 can be anywhere from 0.5 μm to or over 100 μm, depending on desired functionality and breakdown voltage. The channel region 610, which can have a n+ conductivity type with a dopant concentration similar to the first GaN epitaxial layer 601, can be anywhere from between 0.1 μm and 10 μm thick, and the width of the channel region 610 (i.e., the distance between gate regions) for a normally-off vertical JFET can be between 0.5 μm and 10 μm. For a normally-on vertical JFET, the width of the channel region 610 can be greater. The source region 611 can have a thickness of between 500 Å and 5 μm and an n-type conductivity with a dopant concentration equal to or greater than $1 \times 10^{18}$ cm$^{-3}$. The gate regions can be from 0.1 μm and 5 μm thick and have a p+ conductivity type with dopant concentrations in a range from about $1 \times 10^{17}$ cm$^{-3}$ to about $1 \times 10^{20}$ cm$^3$.

Figure 7:
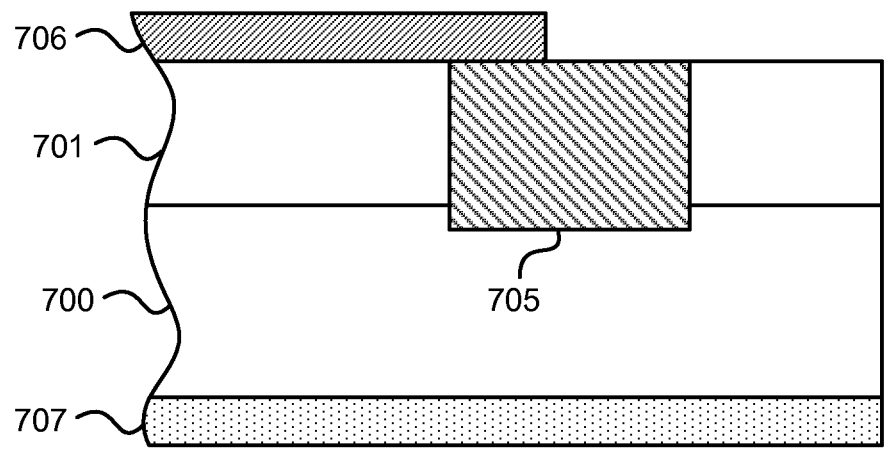
FIG. 7 is a simplified cross-sectional diagram of a Schottky diode according to another embodiment of the present invention.

FIG. 7 is a simplified cross section of a Schottky diode with insulating region 705, which can be formed using trench etching and filling, or using ion implantation, as described above. The Schottky diode can include a GaN substrate 700, first GaN epitaxial layer 701, and first metallic structure 707, similar to those in the structures discussed previously. Here, first metallic structure 707 can function as a cathode of the Schottky diode. A second metallic structure 706 forms a Schottky contact with first GaN epitaxial layer 701 and extends laterally over at least a portion of insulating region 705.

As demonstrated above, the edge termination structures described herein can provide edge termination to a variety of types of semiconductor devices.

Figure 8:
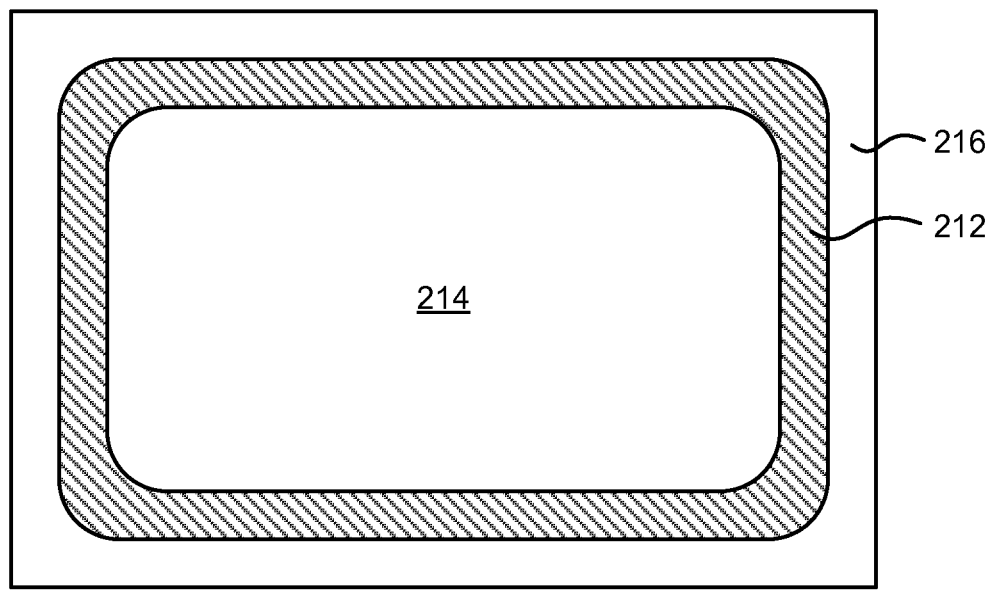
FIG. 8 is a simplified top-view illustration showing one embodiment of a semiconductor device with an edge termination structure according to the present invention.

FIG. 8 illustrates a top view of an embodiment of a semiconductor device with an edge termination structure as described in reference to FIG. 2. The insulating region 212 separates the active device region 214 from the outer region 216. The insulating region 212 can completely circumscribe the active device region 214 to alleviate high electric fields around the entire periphery of the active device and provide a high breakdown voltage for the semiconductor device. In some embodiments, the active device region 214 may comprise a variety of power semiconductor devices.

Figure 9:
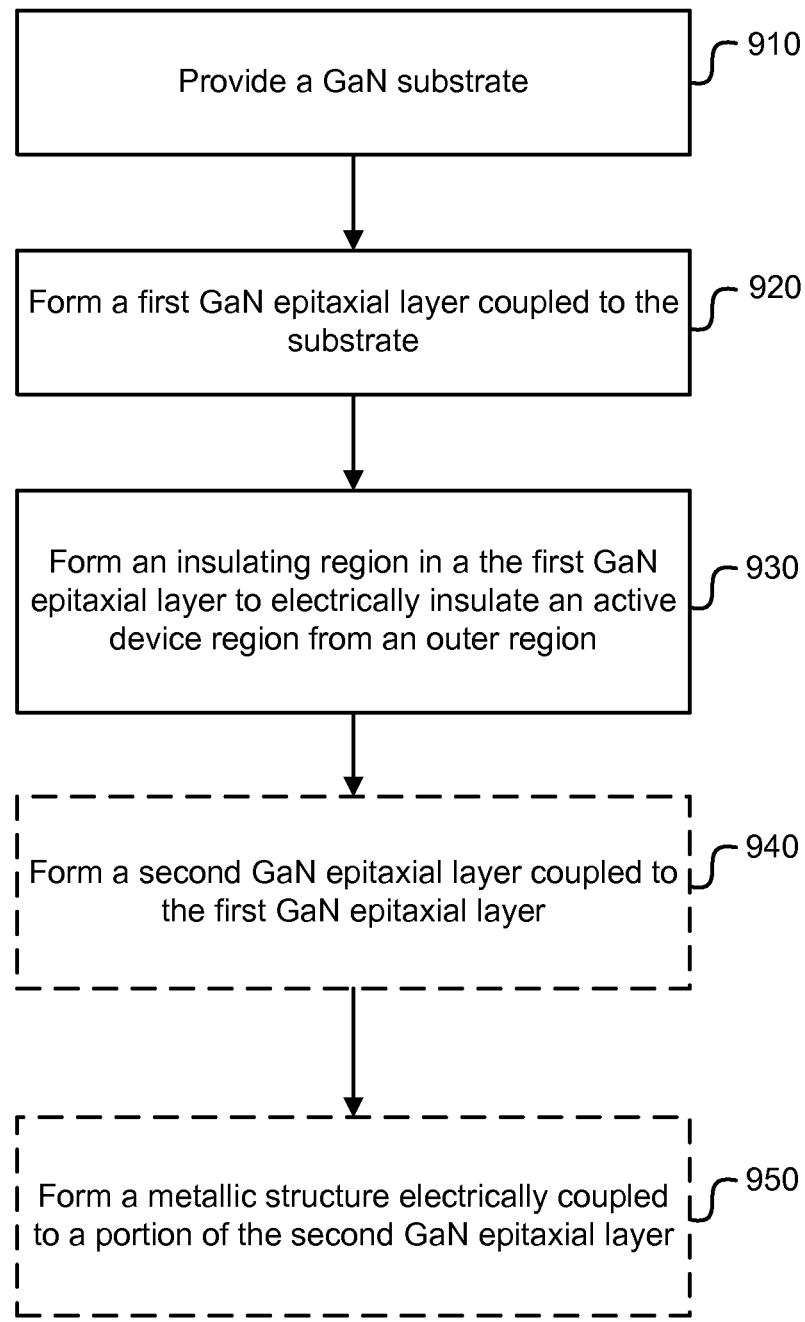
FIG. 9 a simplified flowchart illustrating a method of fabricating an edge termination structure according to another embodiment of the present invention.

FIG. 9 is a simplified flowchart illustrating a method of fabricating an edge termination structure according to an embodiment of the present invention. The method includes providing a III-nitride substrate, such as an n-type GaN substrate (910). The method also includes forming a first GaN epitaxial layer (e.g., an n-type GaN epitaxial layer) coupled to the substrate (920). The first GaN epitaxial layer can be characterized by a first dopant concentration, for example n-type doping.

The method further includes forming an insulating region in the first GaN epitaxial layer to electrically insulate an active device region from an outer region (930). To do so, the insulating region can extend vertically through the first GaN epitaxial layer. As discussed previously, the insulating region can comprise one or more of a variety of materials, including insulating GaN, Al(Ga)N, AlN, and/or a dielectric material.

Optionally, the method can include forming a second GaN epitaxial layer coupled to the first GaN epitaxial layer (940). The second GaN epitaxial layer can have a dopant concentration of the opposite type and greater than the dopant concentration of the first GaN epitaxial layer. In one embodiment, for example, the substrate is characterized by a first n-type dopant concentration, the first GaN epitaxial layer is characterized by a second n-type dopant concentration less than the first n-type dopant concentration, and the second GaN epitaxial layer is characterized by a p-type dopant concentration greater than the second n-type dopant concentration and less than the first n-type dopant concentration. Also optionally, the method can include forming a metallic structure electrically coupled to a portion of the second GaN epitaxial layer (950). Depending on the type of semiconductor structure manufactures (e.g., PN diode, Schottky diode, vertical JFET, etc.) other metallic electrodes may be formed.

It should be appreciated that the specific steps illustrated in FIG. 9 provide a particular method of fabricating an edge termination structure according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. Additionally, the steps may utilize III-nitride materials and layers other then GaN. One of ordinary skill in the art would recognize many variations, modifications, and alternatives.

As illustrated herein, edge termination structures can be provided in any of a variety of shapes and forms, depending on physical features of the semiconductor device for which the edge termination structures provide edge termination. For instance, in certain embodiments, edge termination structures may not circumscribe the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating an edge termination structure, the method comprising:
   providing a GaN substrate of a first conductivity type, the GaN substrate having a first surface and a second surface, the first surface opposite the second surface in a vertical dimension;
   forming a first GaN epitaxial layer of the first conductivity type coupled to the first surface of the GaN substrate; and
   forming an insulating region in a first portion of the first GaN epitaxial layer, wherein the insulating region extends vertically through at least 90% of the first GaN epitaxial layer to separate an active device region of the first GaN epitaxial layer from an outer region of the first GaN epitaxial layer;
   wherein the insulating region circumscribes the active device region.

2. The method of claim 1 wherein the insulating region extends vertically through the first GaN epitaxial layer and into the GaN substrate.

3. The method of claim 1 further comprising:
   forming a second GaN epitaxial layer of a second conductivity type opposite the first conductivity type, the second GaN epitaxial layer being coupled to the first GaN epitaxial layer;
   wherein the insulating region also extends vertically through the second GaN epitaxial layer.

4. The method of claim 3 further comprising forming a metallic structure electrically coupled to a portion of the second GaN epitaxial layer, wherein the metallic structure comprises an Ohmic contact to the second GaN epitaxial layer.

5. The method of claim 3 wherein:
   the GaN substrate is characterized by a first n-type dopant concentration;
   the first GaN epitaxial layer is characterized by a second n-type dopant concentration less than the first n-type dopant concentration; and
   the second GaN epitaxial layer is characterized by a p-type dopant concentration greater than the second n-type dopant concentration and less than the first n-type dopant concentration.

6. The method of claim 1 wherein forming the insulating region comprises a plurality of ion implantations into the first GaN epitaxial layer, each ion implantation step being performed at a different energy such that corresponding implanted profiles overlap vertically to form a substantially continuous implanted region.

7. The method of claim 1 wherein forming the insulating region comprises:
   etching a trench in the vertically into the first GaN epitaxial layer, and
   filling the trench with an insulating material.

8. The method of claim 7 wherein:
   the insulating material comprises insulating GaN; and
   filling the trench comprises selective epitaxial growth.

9. The method of claim 7 wherein the insulating material comprises a dielectric material.

10. The method of claim 1 further comprising forming a metallic structure electrically coupled to a second portion of the first GaN epitaxial layer, wherein the metallic structure comprises a Schottky contact to the second portion of the first GaN epitaxial layer.

11. The method of claim 1 further comprising forming a metallic structure electrically coupled to the second surface of the GaN substrate.

12. A method of fabricating a vertical power device structure, the method comprising:
   forming an epitaxial structure by:
      providing a III-nitride substrate of a first conductivity type characterized by a first dopant concentration; and
      forming a first III-nitride epitaxial layer of the first conductivity type having a thickness and coupled to a first surface of the III-nitride substrate;
   defining regions of the epitaxial structure by forming an insulating region of the epitaxial structure, wherein the insulating region electrically separates a device region of the epitaxial structure from an outer region of the epitaxial structure; and
   forming one or more active devices using at least the device region of the epitaxial structure, wherein the insulating region extends vertically through at least 90% of the thickness of the first III-nitride epitaxial layer.

13. The method of claim 12 further comprising forming a Schottky metallic structure coupled to the first III-nitride epitaxial layer.

14. The method of claim 12 further comprising:
forming a second III-nitride epitaxial layer of a second conductivity type coupled to the first III-nitride epitaxial layer; and
forming an Ohmic metallic structure coupled to the second III-nitride epitaxial layer.

15. The method of claim 12 further comprising forming an Ohmic metallic structure coupled to a second surface of the III-nitride substrate.

16. The method of claim 12 wherein the insulating region circumscribes the one or more active devices.

17. The method of claim 12 wherein the first III-nitride epitaxial layer is characterized by a second dopant concentration less than the first dopant concentration.

18. The method of claim 12 wherein forming the insulating region comprises:
etching a trench vertically into the first III-nitride epitaxial layer; and
filling the trench with an insulating material.

19. A semiconductor structure comprising:
a GaN substrate having a first surface and a second surface opposing the first surface, wherein the GaN substrate is characterized by a first conductivity type and a first dopant concentration;
a first GaN epitaxial layer of the first conductivity type coupled to the second surface of the GaN substrate, wherein the first GaN epitaxial layer comprises:
an active device region;
an outer region; and
an insulating region disposed between the active device region and the outer region, the insulating region having a thickness greater than 90% of a thickness of the first GaN epitaxial layer.

20. The semiconductor structure of claim 19 further comprising a second GaN epitaxial layer of a second conductivity type coupled to the first GaN epitaxial layer.

21. The semiconductor structure of claim 20 wherein the active device region includes a PN diode, the PN diode comprising at least a portion of the first GaN epitaxial layer and at least a portion of the second GaN epitaxial layer.

22. The semiconductor structure of claim 19 wherein the active device region comprises a Schottky contact electrically coupled to a portion of the first GaN epitaxial layer.

23. The semiconductor structure of claim 22 wherein the Schottky contact extends laterally over at least a portion of the insulating region.

24. The semiconductor structure of claim 19 wherein the active device region includes one or more elements of a vertical JFET.

25. The semiconductor structure of claim 19 wherein the active device region includes at least a portion of a vertical Schottky diode.

26. The semiconductor structure of claim 19 further comprising a field plate coupled to the active device region, the field plate extending laterally over at least a portion of the insulating region.

27. The semiconductor structure of claim 19 wherein the insulating region circumscribes the active device region.

28. The semiconductor structure of claim 19 wherein:
a depletion region is formed adjacent to the insulating region when the semiconductor structure is reverse biased; and
a thickness of the depletion region is less than the thickness of the insulating region.

* * * * *